(12) United States Patent
Cha

(10) Patent No.: US 6,274,394 B1
(45) Date of Patent: Aug. 14, 2001

(54) METHOD AND SYSTEM FOR DETERMINING THE FAIL PATTERNS OF FABRICATED WAFERS IN AUTOMATED WAFER ACCEPTANCE TEST

(75) Inventor: Chia-Yen Cha, Hsinchu (TW)

(73) Assignees: Promos Technologies Inc., Hsinchu (TW); Mosel Vitelic Inc., Hsinchu (TW); Siemens AG, Munich (DE)

( * ) Notice: Subject to any disclaimer, the term of this patent is extended or adjusted under 35 U.S.C. 154(b) by 0 days.

(21) Appl. No.: 09/237,181

(22) Filed: Jan. 25, 1999

(51) Int. Cl.[7] .................. H01L 21/66; G06F 11/00; G01R 31/26
(52) U.S. Cl. .............. 438/14; 371/22.1; 371/27.1; 364/468.17; 364/468.28; 364/579; 702/35; 702/81; 702/185
(58) Field of Search .................. 438/14, 16, 17, 438/5; 364/468.17, 468.28, 579, 578; 371/22.1, 27.1, 16.2, 23, 25.1; 702/35, 81, 185

(56) References Cited

U.S. PATENT DOCUMENTS

| | | | |
|---|---|---|---|
| 5,406,522 | * | 4/1995 | Hirano .................. 365/222 |
| 5,475,624 | * | 12/1995 | West .................. 364/578 |
| 5,771,243 | * | 6/1998 | Lee et al. .................. 371/27.1 |
| 5,963,881 | * | 10/1999 | Kahn et al. .................. 702/35 |

\* cited by examiner

Primary Examiner—David Nelms
Assistant Examiner—Reneé R. Berry
(74) Attorney, Agent, or Firm—Jiawei Huang; J.C. Patents

(57) ABSTRACT

A method and system is provided for determining the fail patterns of fabricated wafers in an automated WAT procedure. First, N test items are performed on selected samples from each lot of fabricated wafers, from which a total of N fail percentages are obtained respectively from the N test items. Next, the N fail percentages are formulated as an N-dimensional test-result vector, in which the (i)th element represents the fail percentage of the (i)th test item, for i=1 to N. Subsequently, an N×N conversion matrix is provided to convert the N-dimensional test-result vector into an N-dimensional fail-pattern vector with fail patterns as a basis. In this fail-pattern vector, the (j)th element represents the percentage of the (j)th fail pattern, for j=1 to N. By the method and system, the results from the WAT procedure can be extended to all the fabricated wafers in the lot. It also allows the test engineer group to have a collective overview on the statistics of the test results and perform analysis from the correlation of the test data with the fabrication equipment, fabricated wafers, and lots so that the test data can be more fully utilized than in the prior art.

1 Claim, 4 Drawing Sheets

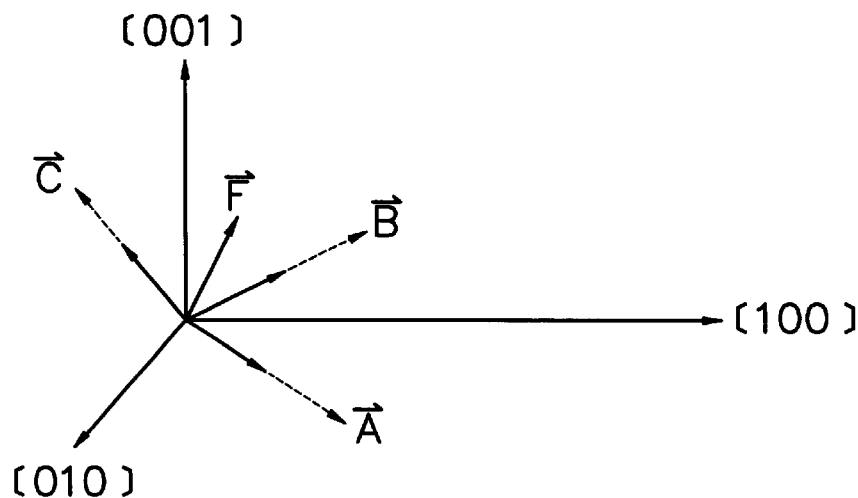
FIG. 4
$$P = T \times F$$
$$\begin{bmatrix} 0.2 \\ 0 \\ 0 \\ 0 \\ 0.3 \end{bmatrix} = \begin{bmatrix} 1 & 0 & 0 & 1 & 0 \\ 0 & 0 & 0 & 0 & 0 \\ 0 & 1 & 0 & 0 & 0 \\ 0 & 0 & 0 & 1 & 0 \\ 1 & 0 & 0 & 0 & 1 \end{bmatrix} \times \begin{bmatrix} 0.2 \\ 0 \\ 0.4 \\ 0 \\ 0.1 \end{bmatrix}$$
FIG. 5
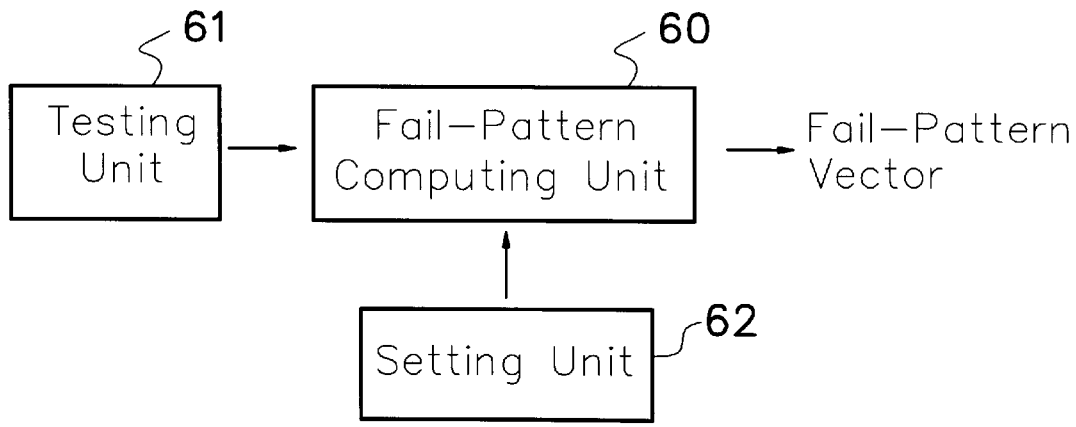
FIG. 6

| | Gate Ox Breakdown | Junction Leakage | GC TO GC Short Mode | GC TO GC Short SS Etching | GC TO CD Short (Rectification) | GC TO GC Short (Resistivity) | GC TO SS Short (Rectification) | GC TO SS Resistivity | GC TO MO Short Via CD | GC TO MO Short Via SS | GC TO MO Direct Short |
|---|---|---|---|---|---|---|---|---|---|---|---|
| GC TO ALL (+,SS,CD) | X | | X | X | | X | X | X | X | X | X |
| GC TO ALL (-,SS,CD) | X | | X | X | X | X | | X | X | X | X |
| GC TO ALL (+,SS) | X | | X | X | | | X | | | X | X |
| GC TO ALL (-,SS) | X | | X | X | | | X | X | | X | X |
| GC TO ALL (+,CD) | X | | X | | | X | | | X | | X |
| GC TO ALL (-,CD) | X | | X | | X | X | | | X | | X |
| GC TO ALL (+) | X | | X | | | | | | | | X |
| GC TO ALL (-) | X | | X | | | | | | | | X |
| MO TO ALL (+,SS,CD,ON) | | X | | X | | | | X | X | X | X |
| MO TO ALL (+,SS,CD) | | X | | | | | | | X | X | X |
| MO TO ALL (+,SS,ON) | | | | | | | | | | X | X |
| MO TO ALL (+,SS) | | | | | | | | | | X | X |
| MO TO ALL (-,SS,ON) | | | | | | | | | | X | X |
| MO TO ALL (-,SS) | | | | | | | | | | X | X |
| MO TO ALL (+,CD,ON) | | X | | | | | | | X | | X |
| MO TO ALL (+,CD) | | X | | | | | | | X | | X |
| MO TO ALL (+,ON) | | | | | | | | | | | X |
| MO TO ALL (+) | | | | | | | | | | | X |
| MO TO ALL (-,ON) | | | | | | | | | | | X |
| MO TO ALL (-) | | | | | | | | | | | X |

FIG. 8

METHOD AND SYSTEM FOR DETERMINING THE FAIL PATTERNS OF FABRICATED WAFERS IN AUTOMATED WAFER ACCEPTANCE TEST

BACKGROUND OF THE INVENTION

1. Field of the Invention

This invention relates to integrated circuit (IC) testing technology, and more particularly, to a method and system for determining the fail patterns of fabricated wafers in an automated Wafer Acceptance Test (WAT).

2. Description of Related Art

In IC fabrication, there are many factors that affect the acceptance of the fabricated wafers. Therefore, a wafer is typically formed with some testing structures together with the internal circuitry of the wafer for the purpose of performing testing on the internal circuitry of the wafer. As a standard practice, fabricated wafers should undergo the what is known as a Wafer Acceptance Test (WAT) procedure to check whether they are acceptable. However, since each fabrication process produces a very great quantity of wafers, it is not feasible to perform the WAT procedure on all the fabricated wafers. Typically, only a number of randomly selected samples from each lot are tested. A WAT procedure typically includes a number of different test items performed separately on the selected samples, and the results from these test items are then analyzed by statistical methods to cover all the fabricated wafers in the lot.

A wafer is typically formed with a test fixture, called kerf-macro structure, in the kerf between the various dice in the wafer, which can be used to perform various test items on the wafer for the purpose of collecting parametric test data from the wafer. These parametric test data can help determine the health-of-line of the wafer fabrication process to judge whether the fabricated wafers are acceptable or not. These data can also help determine the problems in the fabrication process that cause the rejection so that the problems can be corrected.

The foregoing testing is performed on a randomly selected set of samples from all the fabricated wafers in each lot, and the results are then extended by statistical methods to cover all the fabricated wafers in the lot. However, since the amount of the test data is quite enormous, only a small portion thereof is used by the test engineer group for analysis. By conventional testing methods, since all the test items are analyzed individually rather than collectively from the fail patterns thereof, the results may be inadequate to point out some particular problems in the fabrication process.

As a summary, conventional testing methods have the following drawbacks. First, the test items are analyzed individually rather than collectively, so that the results may be inadequate. Second, it is impossible to perform analysis from the correlation of the test data with the fabrication equipment, fabricated wafers, and lots. Third, the use of the test data for analysis is inadequate.

SUMMARY OF THE INVENTION

It is therefore an objective of the present invention to provide a method and system for determining the fail patterns of fabricated wafers in an automated WAT procedure, which can analyze the test data in a collective manner from the fail patterns of the fabricated wafers.

It is another objective of the present invention to provide a method and system for determining the fail patterns of fabricated wafers in an automated WAT procedure, which can perform analysis from the correlation of the test data with the fabrication equipment, fabricated wafers, and lots so that the test data can be more fully utilized than in the prior art.

In accordance with the foregoing and other objectives of the present invention, a method and system is provided for determining the fail patterns of fabricated wafers in an automated WAT procedure. First, a WAT procedure having N test items is performed on the selected samples, from which a total of N fail percentages are respectively obtained from the N test items. Next, the N fail percentages are formulated as an N-dimensional test-result vector, in which the (i)th element represents the fail percentage of the (i)th test item, for i=1 to N. Subsequently, an N×N conversion matrix is provided to convert the N-dimensional test-result vector into an N-dimensional fail-pattern vector with fail patterns as basis. In this fail-pattern vector, the (j)th element represents the percentage of the (j)th fail pattern, for j=1 to N.

By the method and system of the invention, the results from the WAT procedure can be extended to all the lots of fabricated wafers. It also allows the test engineer group to have a collective overview on the statistics of the test results and perform analysis from the correlation of the test data with the fabrication equipment, fabricated wafers, and lots so that the test data can be more fully utilized than in the prior art.

BRIEF DESCRIPTION OF DRAWINGS

The invention can be more fully understood by reading the following detailed description of the preferred embodiments, with reference made to the accompanying drawings, wherein:

FIG. 4 is a schematic diagram of a Cartesian coordinate system used to depict the concept of a vector conversion utilized by the invention;

FIG. 5 shows an example of a matrix manipulation utilized by the method and system of the invention;

FIG. 6 is a schematic block diagram of the system of the invention;

FIG. 8 shows a truth table which is used to obtain a conversion matrix used by the invention.

DETAILED DESCRIPTION OF PREFERRED EMBODIMENTS

Figure 1:
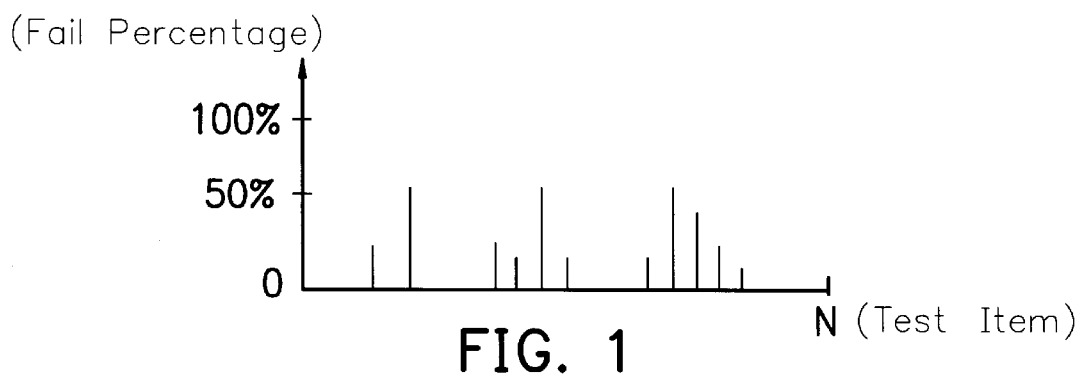
FIG. 1 shows an example of a fail spectrum resulting from N test items in a WAT procedure.

For a WAT procedure including N test items, a fail spectrum can be obtained by assigning the N test items in a predetermined order on the X-axis and representing the fail percentage of each of the test items on the Y-axis. An example of a fail spectrum is shown in FIG. 1. Although the WAT procedure is performed on selected samples, the fail spectrum can nevertheless represent the overall quality of all the fabricated wafers in the tested lot, and can be used for the analysis to determine the problems in the fabrication process that cause such a fail spectrum.

Figure 2A:
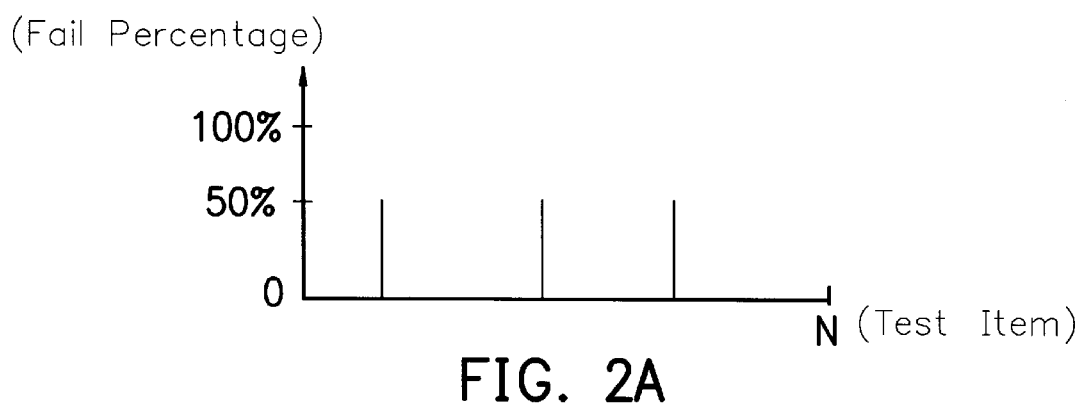
FIG. 2A shows a first example of a subspectrum.
Figure 2B:
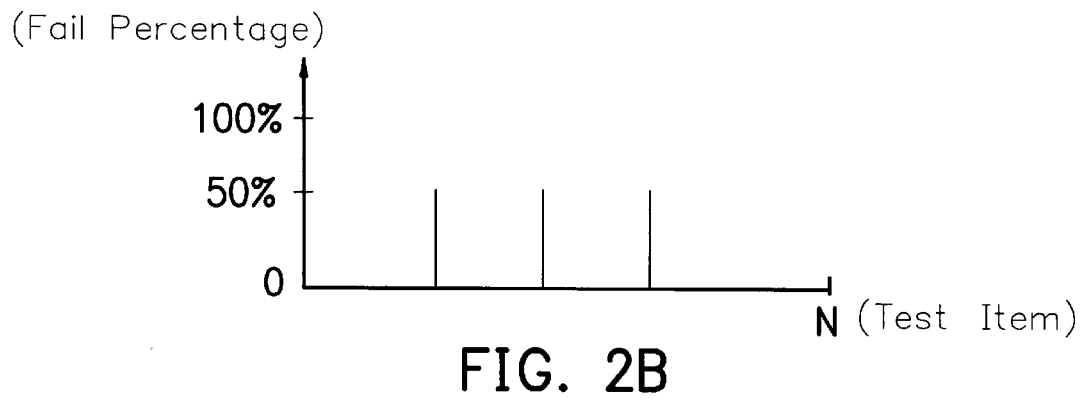
FIG. 2B shows a second example of a subspectrum.

In the testing through the kerf-macro structure, a particular problem in the process leads to the occurrence of peak values at some test items in the fail spectrum. These peak values can be extracted from the fail spectrum to be represented by a subspectrum. Two examples of subspectra are respectively illustrated in FIGS. 2A and 2B. A sub-spectrum can be regarded as a fail pattern of the particular one problem that leads to this subspectrum. If there are N subspectra, it indicates that there are N fail patterns respectively arising from N problems in the fabrication process. It can be deduced that the overall fail pattern of the whole lot of the fabricated wafers, denoted by OFS, is the summation of all the weighted subspectra, i.e., $$OFS = a_1 \cdot pat_1 + a_2 \cdot pat_2 + \ldots + a_N \cdot pat_N$$

where pat$_i$, i=1 to N, represent N fail patterns; and a$_j$, j=1 to N, represent the respective weights of the N fail patterns to the overall fail spectrum.

Figure 3:
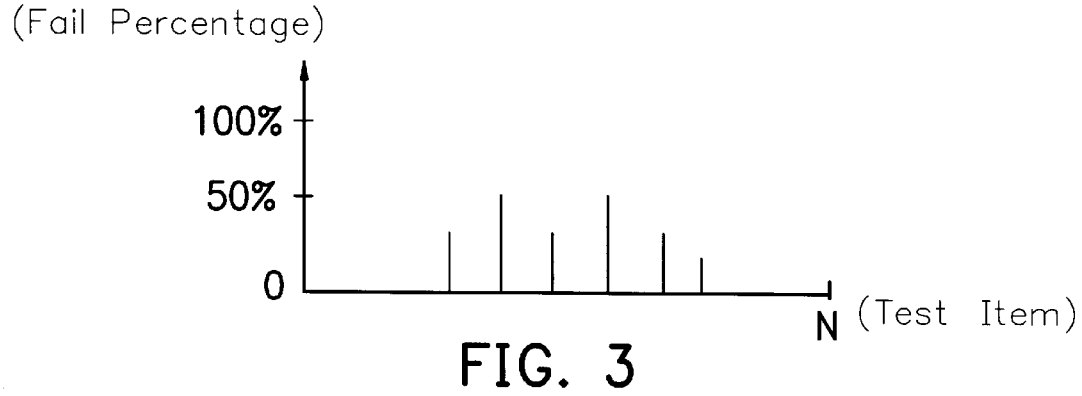
FIG. 3 shows an example of a fail spectrum with fail patterns as the basis.

It is apparent that, if a fail spectrum with test items as a basis were converted to one with fail patterns as a basis, it would better help the test engineer group to find the problems in the fabrication process. FIG. 3 shows an example of a fail spectrum with fail patterns as basis.

Accordingly, the invention is directed to the goal of converting each test item-based fail spectrum into a fail pattern-based fail spectrum to allow each individual entity of the subspectrum to better reveal its contribution to the overall fail spectrum. This concept is analogous to a spectrum analyzer which can identify all the individual constituent elements of a substance from analyzing the overall spectrum of that substance.

Mathematically, a fail spectrum can be regarded as an N-dimensional vector (hereinafter referred to as fail-spectrum vector), with the respective fail percentages of the N test items as its elements. Each test item can be regarded as a unit vector in the Cartesian coordinate system, and the characteristic fail pattern can be regarded as the base vector of a converted Cartesian coordinate system. In accordance with the invention, the fail-spectrum vector is projected onto the base of the characteristic fail pattern. When the fail pattern is determined, the conversion involves just a simple matrix manipulation. Therefore, the test engineer group needs just to define fail patterns in terms of the correlation between fail patterns and empirical results.

FIG. 4 shows an example of the conversion of a vector in a 3-dimensional Cartesian coordinate system. Assume [100], [010], and [001] are three unit vectors, respectively corresponding to three test items. Assume $\vec{F}$ is a vector resulting from the combination of the respective results from the three test items, and $\vec{A}$, $\vec{B}$, $\vec{C}$ are three base vectors of the fail patterns. It is then desired to project the vector $\vec{F}$ onto the base vectors $\vec{A}$, $\vec{B}$, and $\vec{C}$, respectively, to obtain a set of new parameters (a, b, c), each representing the contribution (weight) of each fail pattern to the overall test result. Hence, the vector $\vec{F}$ can be represented as follows:

$$\vec{F} = a \cdot \vec{A} + b \cdot \vec{B} + c \cdot \vec{C}$$

Accordingly, if there are N test items in the WAT procedure, the respective N results from these N test items, expressed in fail percentage, can be formulated as an N-dimensional vector (hereinafter referred to as test-result vector), in which the (i)th element represents the fail percentage of the (i)th test item, for i=1 to N.

Based on the actual fabrication process, a set of N unit vectors can be defined to represent N fail patterns of the fabricated wafers. These fail patterns represent new base vectors. In these fail patterns, some of them can be identical to the test items.

Fundamentally, the invention is intended to convert the test-result vector (which uses test items as a basis) into a fail-pattern vector (which uses fail patterns as a basis).

It is an advantage of the invention that the conversion involves only a matrix manipulation, and no neutral network, so that the result can be quickly achieved.

Hence, the N fail percentages respectively from the N test items can be formulated as a test-result vector, and this test-result vector can be converted into a vector with fail patterns as a basis through simple matrix manipulation, i.e., $$P = T \times F$$

where

F is a test-result vector with a test item as a basis;

P is a fail pattern with fail patterns as a basis; and

T is a predetermined conversion matrix whose elements are determined based on the empirical data from the relationships between test items and known process problems (to be detailed later).

An example of the conversion is shown in FIG. 5, in which N=5. As shown, the conversion matrix T is a matrix whose elements are either 0 or 1. In this example, assume $$F = [0.2, 0, 0.4, 0, 0.1] \text{ and } T = \begin{bmatrix} 1 & 0 & 0 & 1 & 0 \\ 0 & 0 & 0 & 0 & 0 \\ 0 & 1 & 0 & 0 & 0 \\ 0 & 0 & 0 & 1 & 0 \\ 1 & 0 & 0 & 0 & 1 \end{bmatrix} \text{ then,}$$

$$P = T \times F$$
$$= [0.2, 0, 0, 0, 0.3]$$

then,

P=T×F

=[0.2, 0, 0, 0, 0.3]

FIG. 6 is a schematic block diagram of the system of the invention. As shown, the system of the invention includes a fail-pattern computing unit 60, a testing unit 61, and a setting unit 62. The testing unit 61 is used to perform N test items on selected samples from one lot of fabricated wafers. The results from these N test items are then formulated as a test-result vector and transferred to the fail-pattern computing unit 60 for further processing. The fail-pattern computing unit 60 then performs a conversion process on the test-result vector by multiplying it with a predetermined conversion matrix to obtain a fail-pattern vector. The conversion matrix is predetermined by the test engineer group and input to the fail-pattern computing unit 60 by using the setting unit 62. The output fail-pattern vector from the fail-pattern computing unit 60 can be then used by the test engineer group for analysis of any problems in the fabrication process.

Figure 7:
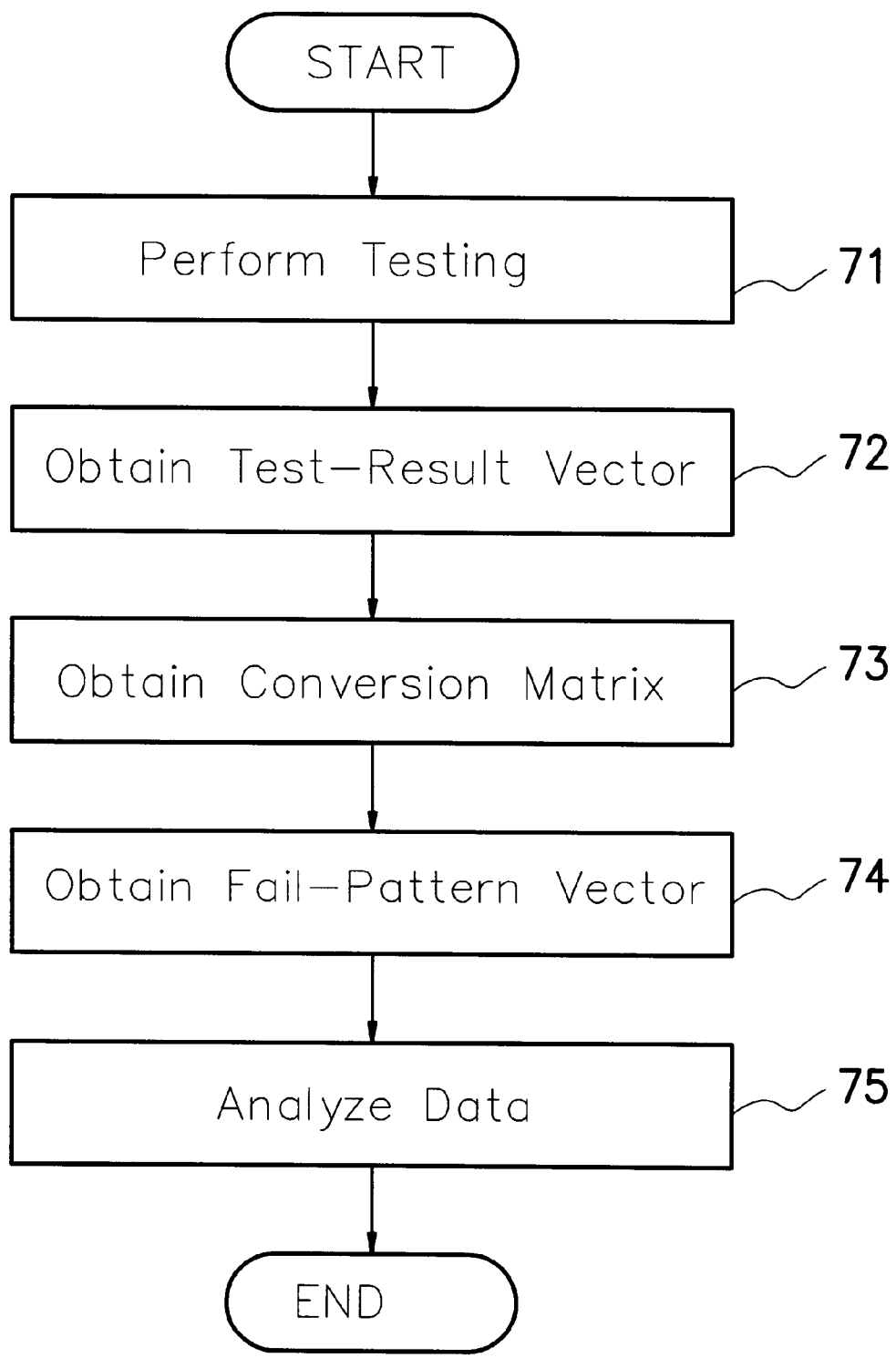
FIG. 7 is a flow diagram showing the procedural steps carried out by the method of the invention for determining the fail patterns of fabricated wafers in automated WAT procedure.

FIG. 7 is a flow diagram showing the procedural steps carried out by the method of the invention for determining the fail patterns of fabricated wafers in an automated WAT procedure.

As shown, in the first step 71, a WAT procedure, which includes a number of N test items, is performed on selected samples from one lot of fabricated wafers. From each of the N test items, a fail percentage is obtained.

In the next step 72, the N fail percentages obtained respectively from the N test items are formulated as an N-dimensional test-result vector, in which the (i)th element represents the fail percentage of the (i)th test item, for i=1 to N.

In the next step 73, the test-result vector is converted into a fail-pattern vector by multiplying it with a conversion matrix which is based on the empirical data from the relationships between test items and known process problems.

In the next step 74 the fail-pattern vector with fail patterns as a basis is obtained through matrix manipulation.

In the next step 75, the data of the fail-pattern vector are furnished to the test engineer group for analysis to determine any probable problems in the fabrication process that cause the occurrence of these fail patterns in the fail-pattern vector.

In the foregoing procedure, the conversion matrix is determined by the test engineer group based on the actual test items and the problems in the fabrication process. An example of determining the conversion matrix is described in the following.

The invention can be utilized on the testing of any types of wafers, such as dynamic random-access memory (DRAM) wafers. DRAM wafers have a wide kerf so that test fixtures can be easily mounted thereon for testing the internal circuitry of the DRAM device.

The WAT procedure on DRAMs is primarily used to test whether the front-end-of-line structure beneath the first metallization layer (customarily called Metal 0 and abbreviated as M0) is well-fabricated without undesired short-circuits, leakage currents, and open-circuits. This task is achieved by what is called a defect array, which is an inoperable array structure formed in each fabricated wafer and can be used to apply a direct current to the internal circuit of the DRAM device to test for short-circuits, leakage currents, and open-circuits. A number of defect arrays with different structures are typically provided in the DRAM wafer for various testing requirements that can help narrow the scope of the source of the problems. In the DRAM wafer, a plurality of curved conductive structures and comb-like conductive structures, i.e., the M0 layers and the gate contacts (GC) in the DRAM device, are formed over the defect array. The defect array can be used to test the current-to-voltage characteristics of these conductive structures by applying a direct current thereto. If the current is not present between two separate curved conductive structures, it indicates that these two conductive structures are open-circuited. If the magnitude of a current flowing between a curved conductive structure and a comb-like conductive structure exceeds an intrinsic leakage level, it indicates that these two conductive structures are short-circuited. Moreover, leakage can be tested by detecting the conductivity between a bias-supplying structure and the ground, and the diode effect can be tested by inverting the polarity of the bias.

There are four types of defect arrays: (1) a first type that has both contact-to-diffusion (CD) structures and surface-strap (SS) structures; (2) a second type that has CD structures and no SS structures; (3) a third type that has SS structures and no CD structures; and a fourth type that has no CD structures and no SS structures.

The testing through the wide-kerf test fixture is performed to check whether the connections among the CD structures and the SS structures are open-circuited or short-circuited. Moreover, the GC layers can be set at a high-voltage state or a low-voltage state for testing the electrical conductive states among the M0 structures.

FIG. 8 shows a truth table which is used to obtain the conversion matrix used by the invention. In this table, each row represents one test item. The "+" mark in the parenthesis indicates that a positive bias is applied; the "–" mark indicates that a negative bias is applied; and "ON" indicates that a high-voltage logic state is applied to the GC structures. Moreover, each column represents a process fail factor to the test items in the rows; if "X" is marked at the intersection of a certain test item and a certain process fail factor, it indicates that the process fail factor would likely cause the test item to fail. For example, the 8th test item is "GC to all (–)", and the process fail factors of this test item that are marked with "X" include "Gate Ox breakdown", "GC-to-GC short", and "GC-to-M0 direct short". It indicates that these three process fail factors would likely cause the test item, "GC to all (–)", to fail. Moreover, the 5th process fail factor is "GC-to-CD short (rectification)", and those test items that might fail due to this process fail factor include the 2nd test item, "GC-to-all (–, SS, CC)", and the 6th test item, "GC-to-all '(–, CD)".

The foregoing truth table of FIG. 8 is equivalent to the collection of every unit fail vector and thus can be used to build the conversion matrix. In accordance with the invention, the conversion matrix obtained from such a truth table is used to convert the test-result vector into a fail-pattern vector. The fail-pattern vector allows the test engineer group to analyze for the problems in the fabrication process in terms of process fail factors.

Therefore, in accordance with the invention, when one lot of fabricated wafers is obtained, a WAT procedure including N test items is performed on selected samples from the lot. The resulting test-result vector is then converted into a fail-pattern vector by multiplying the test-result vector with a predetermined conversion matrix. This allows the test engineer group to determine each individual process fail factor that causes a particular problem to the fabricated wafers. Therefore, the invention can help the test engineer group to perform analysis from the correlation of the test data with the fabrication equipment, fabricated wafers, and lots so that the test data can be more fully utilized than the prior art.

In conclusion, the method and system of the invention has the following advantages over the prior art.

(1) The results from the WAT procedure can be extended to all the lots of fabricated wafers.

(2) The invention allows the test engineer group to have a collective overview on the statistics of the test results.

(3) The invention can determine the correlation among the fail patterns, including the fabrication equipment, wafers, and each lot of the fabricated wafers.

Therefore, the invention allows the WAT data to be more fully utilized than in the prior art for quality assurance of the IC fabrication.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for determining the fail patterns of fabricated wafers in an automated WAT procedure, comprising the steps of:

(1) performing N test items on selected samples from the fabricated wafers, from which a total of N fail percentages are obtained respectively from the N test items;

(2) formulating the N fail percentages as an N-dimensional test-result vector, in which the (i)th element represents the fail percentage of the (i)th test item, for i=1 to N;

(3) providing an N×N conversion matrix based on empirical data from the relationships between test items and known process problems; and (4) obtaining an N-dimensional fail-pattern vector with fail patterns as a basis by multiplying the N-dimensional test-result vector with the N×N conversion matrix, wherein a resulting fail-pattern vector has N elements, with the (j)th element representing the percentage of the (j)th fail pattern, for j=1 to N.

* * * * *